United States Patent
Adachi (10) Patent No.: US 7,912,136 B2
(45) Date of Patent: Mar. 22, 2011

(54) DEVICE AND METHOD FOR RECEIVING DIGITAL SIGNAL TRANSMITTED USING OFDM METHOD

(75) Inventor: Naoto Adachi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1177 days.

(21) Appl. No.: 11/554,811

(22) Filed: Oct. 31, 2006

(65) Prior Publication Data

US 2007/0288832 A1 Dec. 13, 2007

(30) Foreign Application Priority Data

May 24, 2006 (JP) ................................ 2006-144420

(51) Int. Cl.
*H04K 1/10* (2006.01)
*H04L 27/28* (2006.01)

(52) U.S. Cl. ........ 375/260; 315/261; 315/262; 315/279; 315/329; 315/341; 714/795; 714/756; 714/753; 714/702

(58) Field of Classification Search .......... 375/260–262, 375/279, 329, 341; 370/510; 714/795, 756, 714/753, 702
See application file for complete search history.

(56) References Cited

U.S. PATENT DOCUMENTS

| 7,075,949 | B2 * | 7/2006 | Okada et al. .................. 370/510 |
| 2003/0081689 | A1 | 5/2003 | Saito | |
| 2006/0045214 | A1 | 3/2006 | Shiina | |
| 2007/0230329 | A1 | 10/2007 | Hayashi et al. | |

FOREIGN PATENT DOCUMENTS

| JP | 2001-320345 A | 11/2001 |
| JP | 2002-77095 | 3/2002 |
| JP | 2003-78839 | 3/2003 |
| JP | 2003-101505 | 4/2003 |
| JP | 2003-134079 A | 5/2003 |
| JP | 2003-188848 | 7/2003 |
| JP | 2004-282625 | 10/2004 |
| JP | 2006-74277 A | 3/2006 |
| KR | 10-2006-0045172 | 5/2006 |
| WO | WO-2005/109713 A1 | 11/2005 |

OTHER PUBLICATIONS

Korean Patent Office Action, mailed Jan 24, 2008 and issued in corresponding Korean Patent Application No. 10-2006-114618.

* cited by examiner

*Primary Examiner* — Phuong Phu
(74) *Attorney, Agent, or Firm* — Fujitsu Patent Center (57) ABSTRACT

A receiver that receives a digital signal transmitted on the basis of an orthogonal frequency division multiplexing (OFDM) method. This receiver comprises a demodulation unit for demodulating the digital signal, a demapping unit for demapping demodulated data output from the demodulation unit, a frequency deinterleave unit for executing a frequency deinterleaving process on data output from the demapping unit, a delay unit for delaying control information superposed on the digital signal by a prescribed time period, and a time deinterleave unit for executing, on the basis of the interleave length specified by the control information delayed by the delay unit, a time deinterleaving process on data on which the frequency deinterleaving process has been executed.

10 Claims, 9 Drawing Sheets

| HIERARCHY A | IL | SIZE | NUMBER OF BITS |
|---|---|---|---|
| QPSK | I=1 | 1 | 6 |
| QPSK | I=2 | 2 | 6 |
| QPSK | I=4 | 4 | 6 |
| 16QAM | I=1 | 2 | 6 |
| 16QAM | I=2 | 4 | 6 |
| 16QAM | I=4 | 8 | 6 |

FIG. 6B

| HIERARCHY A | IL | SIZE | NUMBER OF BITS |
|---|---|---|---|
| QPSK | I=2 | 1 | 6 |
| QPSK | I=4 | 2 | 6 |
| QPSK | I=8 | 4 | 6 |
| 16QAM | I=2 | 2 | 6 |
| 16QAM | I=4 | 4 | 6 |
| 16QAM | I=8 | 8 | 6 |

FIG. 6C

| HIERAR-CHY A | IL | HIERAR-CHY B | IL | SIZE | NUMBER OF BITS |
|---|---|---|---|---|---|
| QPSK | I=1 | QPSK | I=1 | 3 | 6 |
| QPSK | I=1 | QPSK | I=2 | 5 | 6 |
| QPSK | I=1 | QPSK | I=4 | 9 | 5 |
| QPSK | I=2 | QPSK | I=1 | 4 | 6 |
| QPSK | I=2 | QPSK | I=2 | 6 | 6 |
| QPSK | I=2 | QPSK | I=4 | 10 | 4 |
| QPSK | I=4 | QPSK | I=1 | 6 | 6 |
| QPSK | I=4 | QPSK | I=2 | 8 | 6 |
| QPSK | I=4 | QPSK | I=4 | 12 | 4 |
| QPSK | I=1 | DQPSK | I=1 | 3 | 6 |
| QPSK | I=1 | DQPSK | I=2 | 5 | 6 |
| QPSK | I=1 | DQPSK | I=4 | 9 | 5 |
| QPSK | I=2 | DQPSK | I=1 | 4 | 6 |
| QPSK | I=2 | DQPSK | I=2 | 6 | 6 |
| QPSK | I=2 | DQPSK | I=4 | 10 | 4 |
| QPSK | I=4 | DQPSK | I=1 | 6 | 6 |
| QPSK | I=4 | DQPSK | I=2 | 8 | 6 |
| QPSK | I=4 | DQPSK | I=4 | 12 | 4 |
| QPSK | I=1 | 16QAM | I=1 | 5 | 6 |
| QPSK | I=1 | 16QAM | I=2 | 9 | 5 |
| QPSK | I=1 | 16QAM | I=4 | 17 | 2 |
| QPSK | I=2 | 16QAM | I=1 | 6 | 6 |
| QPSK | I=2 | 16QAM | I=2 | 10 | 4 |
| QPSK | I=2 | 16QAM | I=4 | 18 | 2 |
| QPSK | I=4 | 16QAM | I=1 | 8 | 6 |
| QPSK | I=4 | 16QAM | I=2 | 12 | 4 |
| QPSK | I=4 | 16QAM | I=4 | 20 | 2 |
| 16QAM | I=1 | 16QAM | I=1 | 6 | 6 |
| 16QAM | I=1 | 16QAM | I=2 | 10 | 4 |
| 16QAM | I=1 | 16QAM | I=4 | 18 | 2 |
| 16QAM | I=2 | 16QAM | I=1 | 8 | 5 |
| 16QAM | I=2 | 16QAM | I=2 | 12 | 4 |
| 16QAM | I=2 | 16QAM | I=4 | 20 | 2 |
| 16QAM | I=4 | 16QAM | I=1 | 12 | 4 |
| 16QAM | I=4 | 16QAM | I=2 | 16 | 3 |
| 16QAM | I=4 | 16QAM | I=4 | 24 | 2 |

FIG. 6D

| HIERAR-CHY A | IL | HIERAR-CHY B | IL | SIZE | NUMBER OF BITS |
|---|---|---|---|---|---|
| QPSK | I=2 | QPSK | I=2 | 3 | 6 |
| QPSK | I=2 | QPSK | I=4 | 5 | 6 |
| QPSK | I=2 | QPSK | I=8 | 9 | 5 |
| QPSK | I=4 | QPSK | I=2 | 4 | 6 |
| QPSK | I=4 | QPSK | I=4 | 6 | 6 |
| QPSK | I=4 | QPSK | I=8 | 10 | 4 |
| QPSK | I=8 | QPSK | I=2 | 6 | 6 |
| QPSK | I=8 | QPSK | I=4 | 8 | 6 |
| QPSK | I=8 | QPSK | I=8 | 12 | 4 |
| QPSK | I=2 | DQPSK | I=2 | 3 | 6 |
| QPSK | I=2 | DQPSK | I=4 | 5 | 6 |
| QPSK | I=2 | DQPSK | I=8 | 9 | 5 |
| QPSK | I=4 | DQPSK | I=2 | 4 | 6 |
| QPSK | I=4 | DQPSK | I=4 | 6 | 6 |
| QPSK | I=4 | DQPSK | I=8 | 10 | 4 |
| QPSK | I=8 | DQPSK | I=2 | 6 | 6 |
| QPSK | I=8 | DQPSK | I=4 | 8 | 6 |
| QPSK | I=8 | DQPSK | I=8 | 12 | 4 |
| QPSK | I=2 | 16QAM | I=2 | 5 | 6 |
| QPSK | I=2 | 16QAM | I=4 | 9 | 5 |
| QPSK | I=2 | 16QAM | I=8 | 17 | 2 |
| QPSK | I=4 | 16QAM | I=2 | 6 | 8 |
| QPSK | I=4 | 16QAM | I=4 | 10 | 4 |
| QPSK | I=4 | 16QAM | I=8 | 18 | 2 |
| QPSK | I=8 | 16QAM | I=2 | 8 | 6 |
| QPSK | I=8 | 16QAM | I=4 | 12 | 4 |
| QPSK | I=8 | 16QAM | I=8 | 20 | 2 |
| 16QAM | I=2 | 16QAM | I=2 | 6 | 6 |
| 16QAM | I=2 | 16QAM | I=4 | 10 | 4 |
| 16QAM | I=2 | 16QAM | I=8 | 18 | 2 |
| 16QAM | I=4 | 16QAM | I=2 | 8 | 5 |
| 16QAM | I=4 | 16QAM | I=4 | 12 | 4 |
| 16QAM | I=4 | 16QAM | I=8 | 20 | 2 |
| 16QAM | I=8 | 16QAM | I=2 | 12 | 4 |
| 16QAM | I=8 | 16QAM | I=4 | 16 | 3 |
| 16QAM | I=8 | 16QAM | I=8 | 24 | 2 |

F I G. 7

DEVICE AND METHOD FOR RECEIVING DIGITAL SIGNAL TRANSMITTED USING OFDM METHOD

CROSS REFERENCE TO RELATED APPLICATIONS

This application is based upon and claims the benefit of priority from the prior Japanese Patent Application NO. 2006-144420, filed May 24, 2006, the entire contents of which are incorporated by reference.

BACKGROUND OF THE INVENTION

1. Field of the Invention

The present invention relates to a technique of receiving a digital signal, and particularly to a technique of demodulating a digital signal for which an orthogonal frequency division multiplexing (OFDM) method is employed as a signal transmission method.

2. Description of the Related Art

A method referred to as an orthogonal frequency division multiplexing (OFDM) method is introduced as a method of transmitting a digital signal. The OFDM method is a method of assigning data to a plurality of carriers orthogonal to the frequency axis to transmit the data and in which modulation is conducted by IFFT (inverse FFT (Fast Fourier Transform)) and demodulation is conducted by FFT.

The OFDM method realizes a high efficiency of frequency use such that its application to ground wave digital broadcasting is widely discussed and is employed in ISDB-T (Integrated Services Digital Broadcasting-Terrestrial), which is a standard for ground wave digital broadcasting in Japan.

In ground wave digital broadcasting in Japan (ISDB-T), digital television broadcasting using the UHF band (13ch to 62ch) and digital radio broadcasting using the VHF band (7ch and 8ch) are implemented.

Figure 1A:
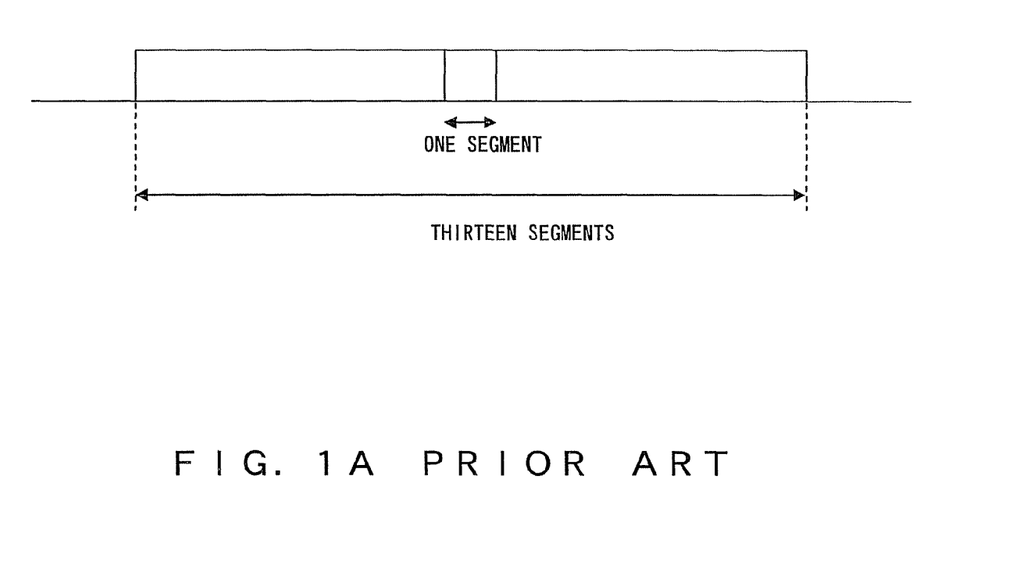
FIG. 1a is a view of the band configuration of a digital broadcasting ground wave in Japan.

In digital television broadcasting, as shown in FIG. 1A, a transmission band of one channel of 6 MHz is divided into thirteen segments. Twelve segments are used for hi-vision broadcasting whose main target is indoor television receivers with fixed reception, and the remaining segment is used for broadcasting whose main target is movable bodies such as mobile terminals and the like (called "one-segment broadcasting"). Depending on channels, broadcasting is performed using all thirteen segments for fixed terminals.

Figure 1B:
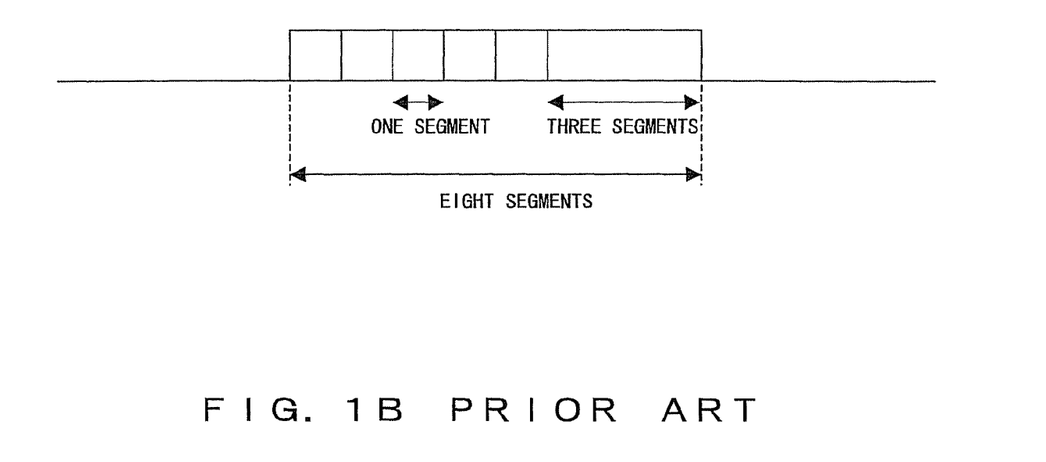
FIG. 1b is another view of the same band configuration of the digital broadcasting ground wave in Japan.

In digital radio broadcasting, as shown in FIG. 1B, the transmission band of one channel of 6 MHz is divided into eight segments, and one or three of these segments are used for broadcasting.

In the above situation, two types of receivers are possible as reception terminals for mobile reception of ground wave digital broadcasting, i.e., a 1-segment receiver that can only perform 1-segment reception and a 1-segment/3-segment compatible receiver that can perform 3-segment reception in addition to 1-segment reception (referred to as "⅓-segment receiver" hereinafter).

Figure 2:
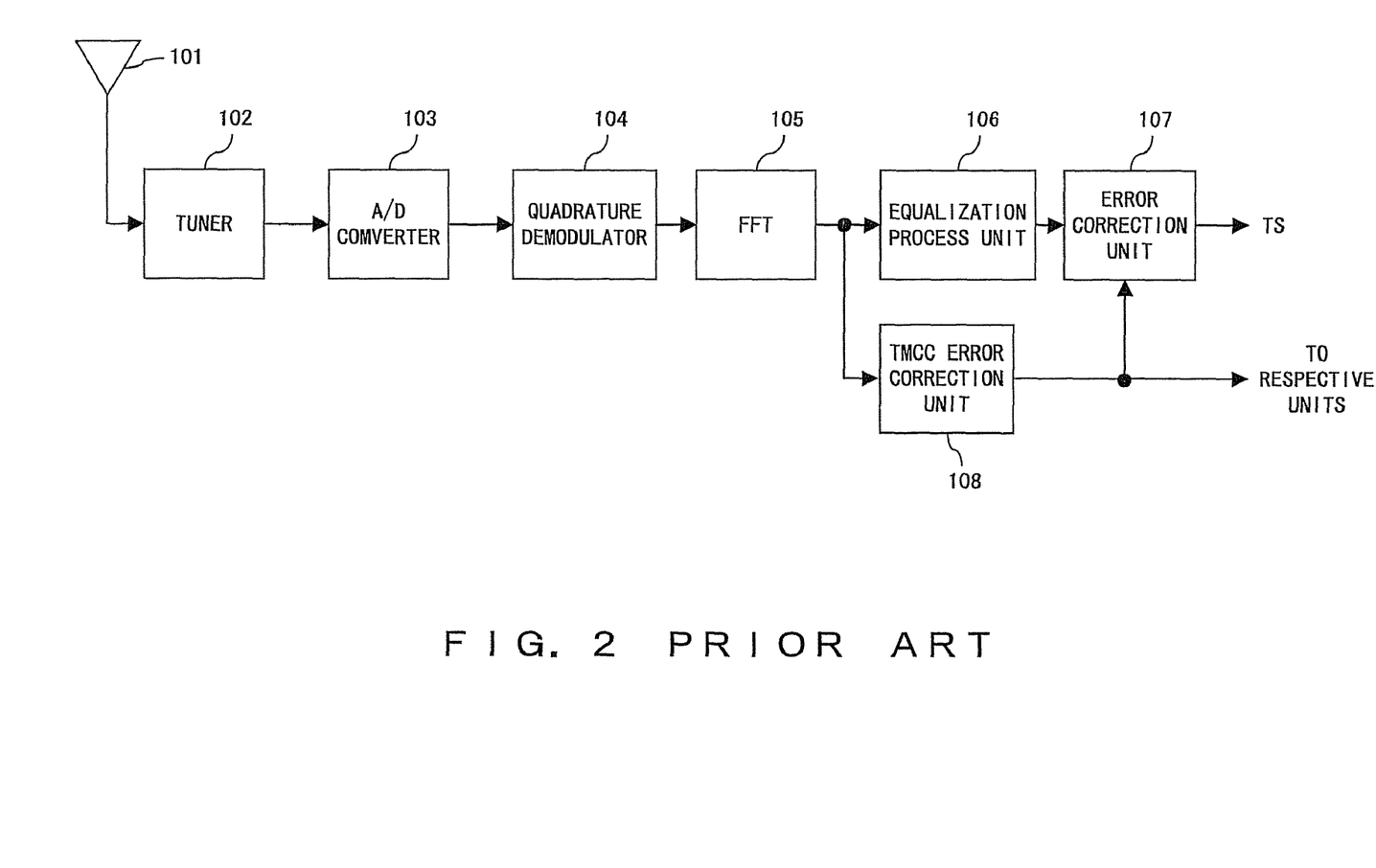
FIG. 2 shows a standard configuration of a receiver of digital broadcasting that is based on ISDB-T.

FIG. 2 shows a normal configuration of a receiver of digital broadcasting in accordance with ISDB-T.

In FIG. 2, a high-frequency signal that has been digitally modulated using the OFDM method is received by an antenna 101. The received high-frequency signal is input into a tuner 102. The tuner 102 selects a channel to be used for the reception, converts the high-frequency signal on the selected channel into an intermediate frequency signal (IF signal), and outputs the intermediate frequency signal to an A/D (analog/digital) converter 103. The A/D converter 103 converts the intermediate frequency signal, which is an analog signal, into a digital signal.

The signal output from the A/D converter 103 is input into a quadrature demodulator 104 in order to be converted into a complex baseband signal. The complex baseband signal is converted from a time domain signal into a frequency domain signal using fast Fourier transform (FFT) performed by an FFT circuit 105, and respective carrier data is obtained.

Thereafter, the carrier data is input into an equalization process unit 106, then an interpolation process of a pilot signal and an equalization process of the carrier data are executed and the carrier data is output as demodulated data. The demodulated data output from the equalization process unit 106 is input into an error correction unit 107 where an error correction process is executed. Thereafter, the demodulated data is output in the form of a TS (Transport Stream).

A part of the carrier data output from the FFT circuit 105 is input into a TMCC (Transmission and Multiplexing Configuration Control) error correction unit 108 where an error correction regarding TMCC information is executed. The TMCC information superposed on a digital signal of the OFDM method is control information in which transmission parameters used in each carrier are specified, including parameters such as modulation method and interleave length in a time interleave. The TMCC information on which the effort correction was executed is used in respective units such as the error correction unit 107 of the receiver of FIG. 2.

Figure 3:
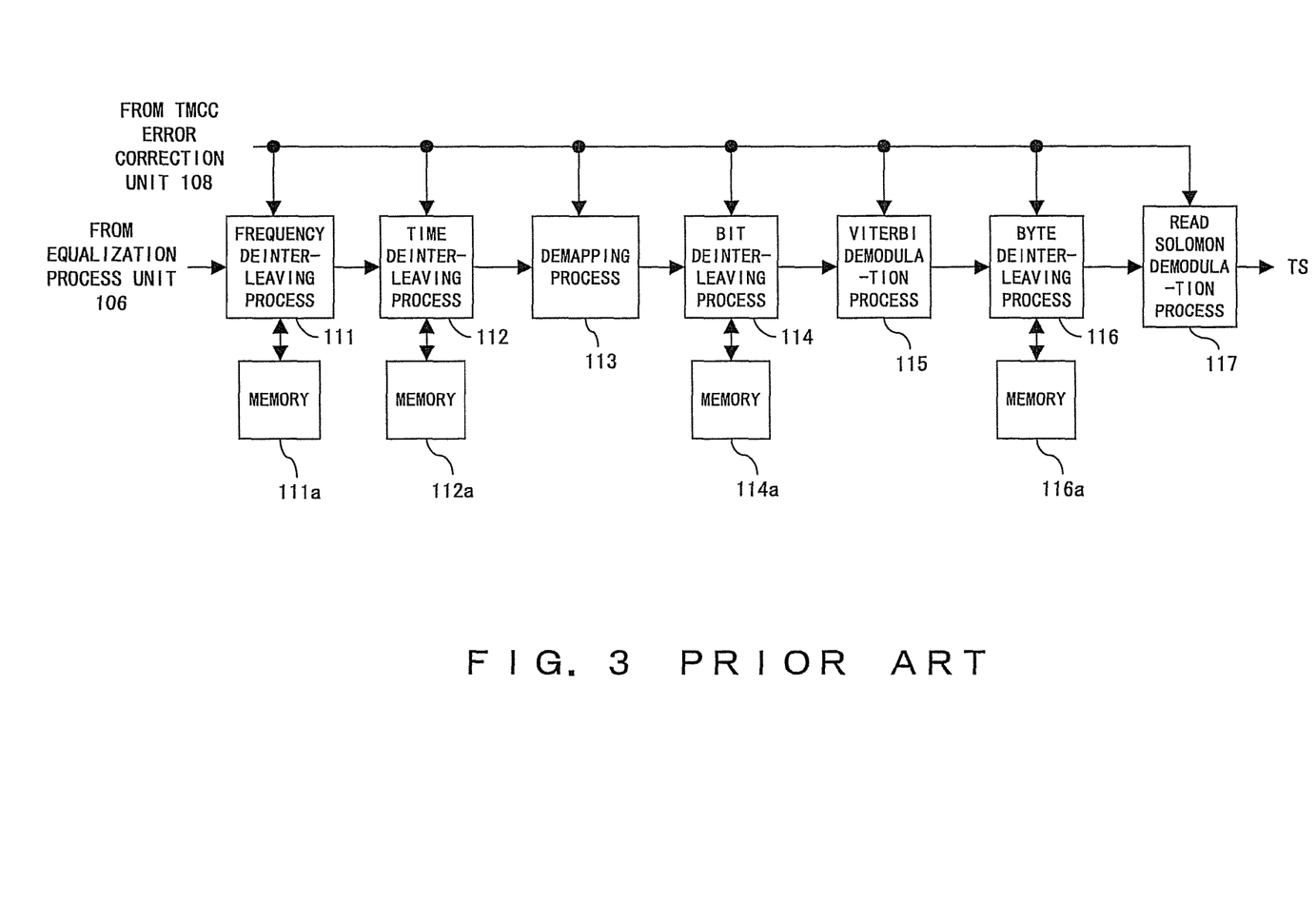
FIG. 3 shows details of the error correction process executed by the error correction unit in FIG. 2.

Next, FIG. 3 is explained. FIG. 3 explains in detail the error correction process executed by the error correction unit 107 of FIG. 2.

As shown in FIG. 3, in the error correction unit 107, a demapping process 113, a viterbi demodulation process 115, a Reed-Solomon demodulation process 117, and various deinterleaving processes are executed. Specifically, a frequency deinterleaving process 111 that is a deinterleaving process of the frequency axis direction, and a time deinterleaving process 112 that is a deinterleaving process of the time axis direction are first executed on the demodulated data output from the equalization process unit 106. Thereafter, the demapping process 113 is executed. Then, a bit deinterleaving process 114 that is a deinterleaving process in units of bits is executed on the data on which the demapping process 113 has been executed; thereafter, the viterbi demodulation process 115 is executed. Further, the data on which the viterbi demodulation process 115 has been executed is converted from serial to parallel in units of bytes. Thereafter, a byte deinterleaving process 116, which is a deinterleaving process in units of bytes, is executed. Then, the Reed-Solomon demodulation process 117 is executed.

Japanese Patent Application Publication No. 2003-188848 discloses a technique in which a time interleaving process is executed on compressed data created by bit compression of demapped data. Thereafter, bit expansion is performed on compressed data that has been subject to a time deinterleaving process in order to reduce memory capacity in an OFDM receiver.

Japanese Patent Application Publication No. 2003-78839 discloses a technique in which, when a voice broadcasting signal is received, the TMCC information is first obtained by handling the band of a frequency conversion unit output signal as the boundary frequency of the pass band of an IF filter that is used in television broadcast reception. Then, the frequency conversion unit and a filter for voice are controlled such that a Fourier transform is performed over a bandwidth of one segment or of three segments in accordance with the broadcasting method specified in the TMCC information;

thereby, reception of both television broadcasting and voice broadcasting is realized in a digital broadcasting receiver that receives a signal demodulated with the OFDM method.

Japanese Patent Application Publication No. 2002-77095 discloses a technique in which I and Q data obtained as a result of quadrature demodulation on a received signal is stored in a storage unit and prescribed data is read from the storage unit to provide it to an FFT circuit. At the same time, prescribed data is read from the storage unit to provide it to a synchronous demodulation circuit in order to integrate the input buffer of the FFT circuit and a delay unit of the synchronous demodulation circuit.

Japanese Patent Application Publication No. 2003-101505 discloses a technique in which pre-demap data specifying the relationship between a reference point on a constellation and the amount of shift from the reference point in accordance with the modulation method of a signal is created from the output of an FFT unit, and in which a time deinterleaving process is executed on the pre-mapping data in which the shift amount has been corrected on the basis of the reliability information of a received signal. These two functions are performed so that the memory capacity required for the time deinterleaving process is reduced in a digital broadcasting receiver that receives a signal demodulated with the OFDM method.

Japanese Patent Application Publication No. 2004-282625 discloses a technique for reducing the memory capacity required for a frequency deinterleaving process by performing demapping and bit compression before executing the frequency deinterleaving process in an OFDM receiver.

In the error correction unit 107 of the ISDB-T receiver shown in FIG. 2, various interleaving processes are executed. As shown in FIG. 3, memory 111a, memory 112a, memory 114a, and memory 116a are included; the deinterleaving processes thus generally require memory capacity for temporarily storing data. Accordingly, the memory prepared for the deinterleaving processes occupies a very large proportion of the entire configuration of the ISDB-T receiver.

Also, in the ⅓-segment receiver, memory capacity for the deinterleaving processes that is three times larger than that in the 1-segment receiver is required. In other words, a large memory capacity has to be provided in the ⅓ segment receiver in order to receive 3-segment broadcasting, which only involves partial operation of the receiver.

SUMMARY OF THE INVENTION

It is an object of the present invention to reduce the memory capacity that is required for deinterleaving processes executed on demodulated data in an OFDM receiver.

An OFDM receiver according to one of aspects of the present invention is an OFDM receiver that receives a digital signal transmitted using the orthogonal frequency division multiplexing (OFDM) method. The OFDM receiver comprises a demodulation unit for demodulating the digital signal, a demapping unit for demapping demodulated data output from the demodulation unit, a frequency deinterleave unit for executing a frequency deinterleaving process on data output from the demapping unit, a delay unit for delaying control information superposed on the digital signal by a prescribed time period, and a time deinterleave unit for executing, on the basis of the interleave length specified by the control information delayed by the delay unit, a time deinterleaving process on data on which the frequency deinterleaving process has been executed.

With the above configuration of executing the demapping process before the deinterleaving processes, it is possible to reduce the memory capacity that is required for the deinterleaving processes executed after the demapping process. Further, by providing the delay unit, the influence of data delays caused by executing the frequency deinterleaving process after the demapping process is mitigated.

In the above OFDM receiver according to the present invention, it is possible for a soft decision to be made with the number of bits determined on the basis of the control information in the demapping process.

According to this configuration, the number of bits in the soft decision can be switched in accordance with the control information such that the memory capacity required for deinterleaving processes can be reduced.

In the above configuration, it is also possible for the number of bits to be determined on the basis of the interleave length.

Further, in the above configuration, it is also possible for the number of bits to be determined on the basis of the modulation method of a subcarrier specified by the control information.

Alternatively, it is also possible for the number of bits to be determined in accordance with the amount of redundant memory that is obtained by subtracting, from the memory capacity supplied to the time deinterleave unit in advance, the amount of memory that is used for the deinterleaving processes.

Thereby, if there is redundancy in the memory capacity prepared for the time deinterleaving process, receiving performance can be improved.

In addition to this, the OFDM reception method according to one of aspects of the present inventions is a method of receiving a digital signal transmitted on the basis of an orthogonal frequency division multiplexing (OFDM) method comprising the demodulation of the digital signal, the demapping of the demodulated data obtained by the demodulation, the execution of a frequency deinterleaving process on the demapped data, the delaying of control information superposed on the digital signal by a prescribed time period, and the execution, on the basis of the interleave length specified by the delayed control information, of a time deinterleaving process on data on which the frequency deinterleaving process has been executed.

By executing the mapping process before the deinterleaving processes, it is possible to reduce the memory capacity required for the deinterleaving processes executed after the demapping process. Further, by delaying the control information, the influence of data delays caused by executing the frequency deinterleaving process after the demapping process is mitigated.

Further, in the above OFDM reception method according to the present invention, it is also possible for a soft decision to be made with the number of bits determined on the basis of the control information in the demapping process.

With this configuration, the number of bits can be switched in accordance with the control information such that the memory capacity required for the deinterleaving processes can be reduced.

In the above configuration, it is possible for the number of bits to be determined on the basis of the interleave length.

Also, in the above configuration, it is possible for the number of bits to be determined on the basis of the modulation method of a subcarrier specified by the control information.

Alternatively, it is also possible for the number of bits to be determined in accordance with amount of redundant memory that is obtained by subtracting, from the memory capacity supplied to the time deinterleaving process in advance, the amount of memory that is used for the time deinterleaving process.

Thereby, if there is a redundancy in the memory capacity prepared for the time deinterleaving process, receiving performance can be improved.

With the above configurations according to the present invention, it is possible to reduce the memory capacity that is required for the deinterleaving processes executed on demodulated data in an OFDM receiver.

BRIEF DESCRIPTION OF THE DRAWINGS

The present invention will be more apparent from the following detailed description when the accompanying drawings are referenced.

DESCRIPTION OF THE PREFERRED EMBODIMENTS

Hereinbelow, embodiments of the present invention will be explained by referring to the drawings.

Figure 4:
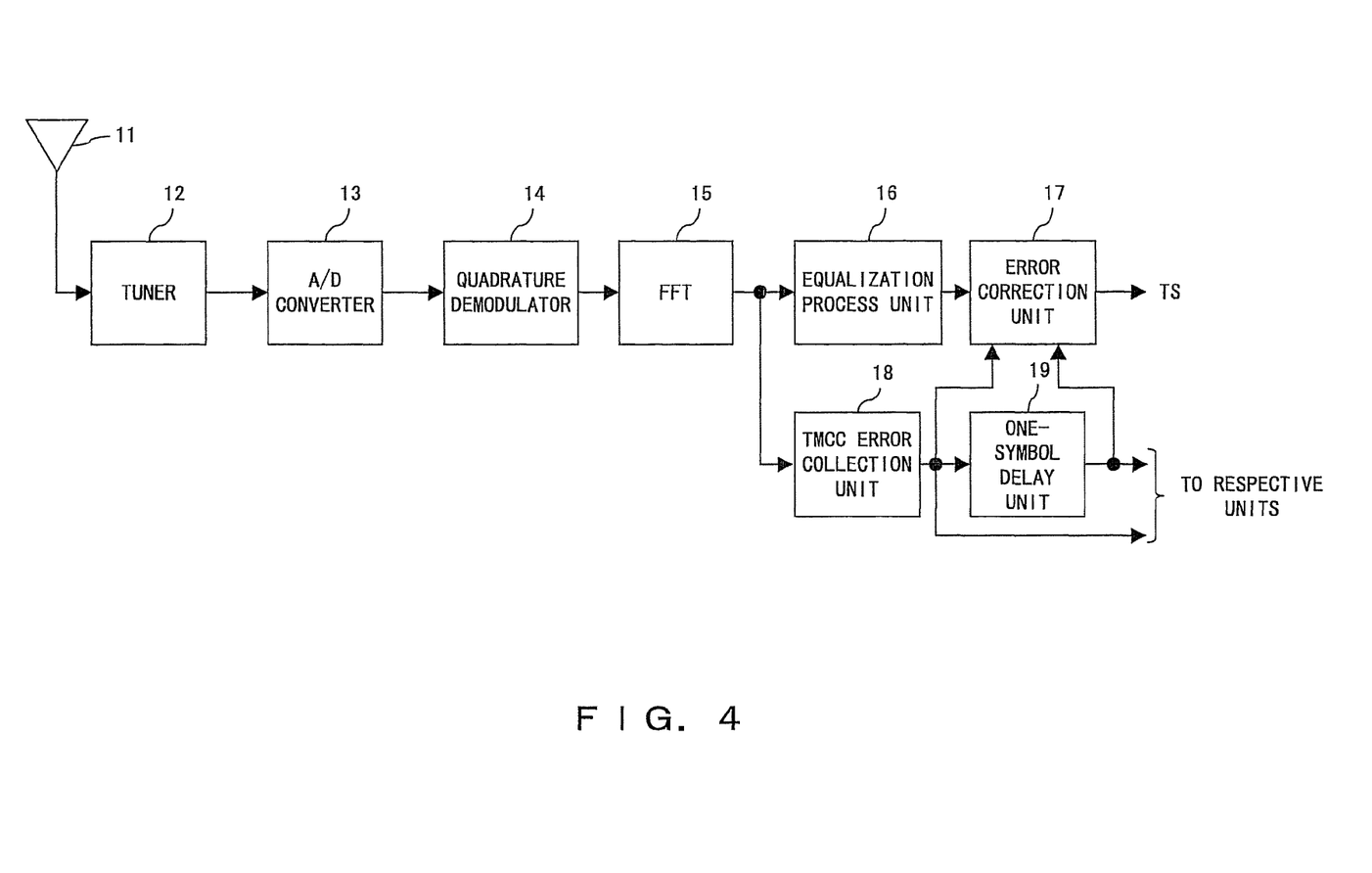
FIG. 4 shows a configuration of a receiver of digital broadcasting that implement the present invention.

FIG. 4 shows a configuration of a digital broadcasting receiver that implements the present invention. This receiver receives digital broadcasting that is based on ISDB-T.

The configuration in FIG. 4 is different from the conventional configuration shown in FIG. 2 in that the configuration in FIG. 4 is provided with a one-symbol delay unit 19 for delaying IMCC information output from a TMCC error correction unit 18.

In FIG. 4, a high-frequency signal that has been digitally modulated on the basis of an OFDM method is received by an antenna 11. The received high-frequency signal is input into a tuner 12. The tuner 12 selects a channel to be used for the reception, converts the high-frequency signal on the selected channel into an intermediate frequency signal, and outputs the intermediate frequency signal to an A/D converter 13. The A/D converter 13 converts the intermediate frequency signal, which is an analog signal, into a digital signal.

The signal output from the A/D converter 13 is input into a quadrature demodulator 14 in order to be converting it into a complex baseband signal. The complex baseband signal is converted from a time domain signal into a frequency domain signal via a fast Fourier transform performed by an FFT circuit 15, and respective carrier data is obtained.

Thereafter, the carrier data is input into an equalization process unit 16, then an interpolation process is executed on the pilot signal and an equalization process is executed on the carrier data, and the carrier data is output as demodulated data. The demodulated data output from the equalization process unit 16 is input into an error correction unit 17 where an error correction process is executed on the demodulated data; thereafter, the modulated data is output in the form of a TS (Transport Stream).

A part of the carrier data output from the FFT circuit 15 is input into a TMCC error correction unit 18 where corrections of errors regarding TMCC information are executed.

The one-symbol delay unit 19 delays the TMCC information output from the TMCC error correction unit 18 by one symbol (the minimum time interval that results in a change of the carrier data).

Figure 5:
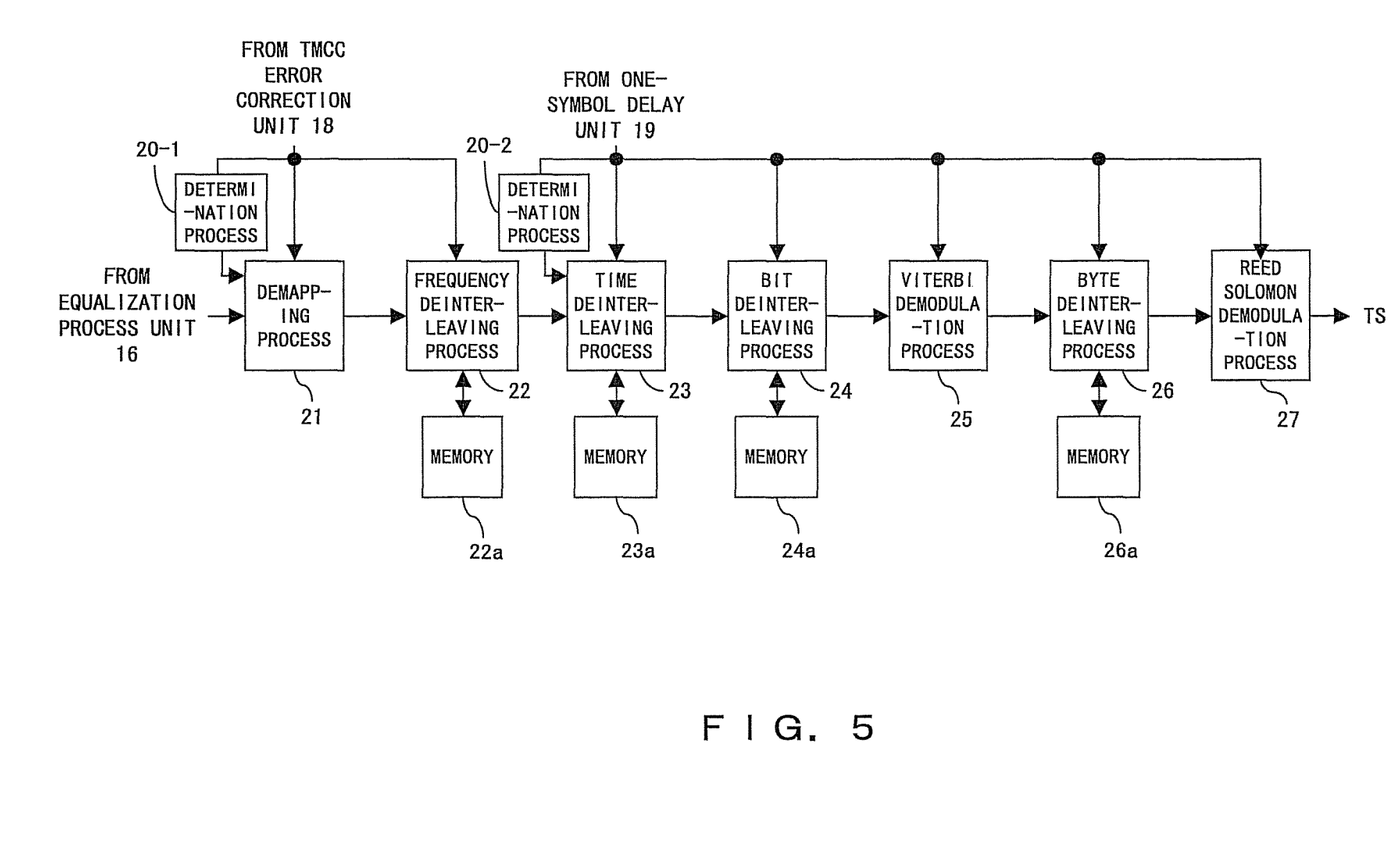
FIG. 5 shows details of the error correction process executed by the error correction unit in FIG. 4.

Next, FIG. 5 is explained. FIG. 5 gives details of the error correction process executed by the error correction unit 17 in FIG. 4.

The steps of the process shown in FIG. 5 are different from those of the error correction process (FIG. 3) executed by the error correction unit 107 of the conventional example shown in FIG. 2 for the following reasons: a demapping process 21 is executed before the frequency deinterleaving process 22 and the time deinterleaving process 23; determination processes 20-1 and 20-2 that determine the number of bits in a soft decision in the demapping process 21 are executed; the determination result of the determination process 20-1 is used in the demapping process 21; the determination result of the determination process 20-2 is used in the time deinterleaving process 23; and the delayed TMCC information output from the one-symbol delay unit 19 is used in the time deinterleaving process 23, a bit deinterleaving process 24, a viterbi demodulation process 25, a byte deinterleaving process 26, and in a Reed-Solomon-demodulation process 27.

In a 12-segment broadcast based on the ISDB-T for fixed reception, 64 QAM (Quadrature Amplitude Modulation) is employed as the carrier modulation method. In this method, processes of later stages have to be executed with a data accuracy of twenty-four bits per symbol obtained as the demodulated data (twelve bits each in the I-axis direction and the Q-axis direction). Therefore, a memory capacity of at least 24 bits is required for deinterleaving processes.

In contrast, in 1-segment broadcasting and 3-segment broadcasting, the 64 QAM is not employed. Instead, QPSK (Quadrature Phase Shift Keying), DQPSK (Differential QPSK), or 16 QAM is employed as the carrier modulation method. In these methods, it is sufficient for the data accuracy of demodulated data to be twelve bits per symbol (six bits each in the I-axis direction and the Q-axis direction).

Therefore, in the first embodiment, which is explained hereinbelow, the data accuracy when the demapping process 21 in FIG. 5 receives the demodulated data output from the equalization process unit 106 is twelve bits per symbol; further, in the determination processes 20-1 and 20-2, the number of bits in a soft decision (a decision in which information in accordance with the distance between a received signal and a reference point on the constellation of a modulated signal is added and that is made in order to improve the gain in the viterbi demodulation process 25) made when a demapping process is executed in the demapping process 21 is always three regardless of the contents of the TMCC information. By this configuration, even when the 16 QAM, whose information amount per symbol is the largest among carrier modulation methods employed in 1-segment broadcasting or 3-segment broadcasting, is employed, the memory capacity required for the deinterleaving processes executed in later stages is twelve bits (4 bits (information amount per symbol in 16 QAM)×3 bits (number of bits in soft decision)=12 bits). Accordingly, the memory capacity required for the processes is reduced.

In the frequency deinterleaving process 22, a deinterleaving process in the frequency axis direction is executed, by using memory 22a, on the data that has received the demapping process 21. In the time deinterleaving process 23, a deinterleaving process in the time axis direction is executed, by using memory 23a, on the data that has received the time deinterleaving process 23. In the bit deinterleaving process 24, a deinterleaving process in units of bits is executed, by using memory 24a, on the data that has received the time deinterleaving process 23.

Thereafter, the viterbi demodulation process 25 is executed on the data that has received the bit deinterleaving process 24. Then, the data that has received the viterbi demodulation process 25 is converted from serial to parallel in units of bytes. Thereafter, a deinterleaving process in units of bytes is executed, by using memory 26a, on the converted data by the byte deinterleaving process 26. Then, the Reed-Solomon demodulation process 27 is executed on the data that has received the byte deinterleaving process 26, and the processes in the error correction unit 17 are terminated.

However, because the frequency deinterleaving process 22 is a process on the frequency axis, a one-symbol delay is caused if the frequency deinterleaving process 22 is executed after the demapping process 21. Accordingly, as shown in FIG. 2, in order to avoid being influenced by this delay, the TMCC information output from the TMCC error correction unit 18 is used after delaying it by a prescribed time period (by one symbol) by using the one-symbol delay unit 19; thereby, the times at which the TMCC information is switched are adjusted in stages later than the frequency deinterleaving process 22.

Figure 6A:
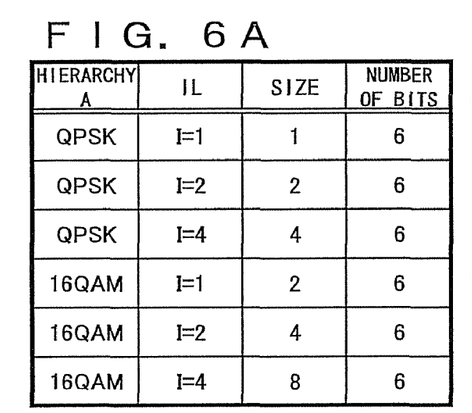
FIG. 6A shows the first table specifying relationships between transmission parameters and memory sizes required for deinterleaving processes.
Figure 6B:
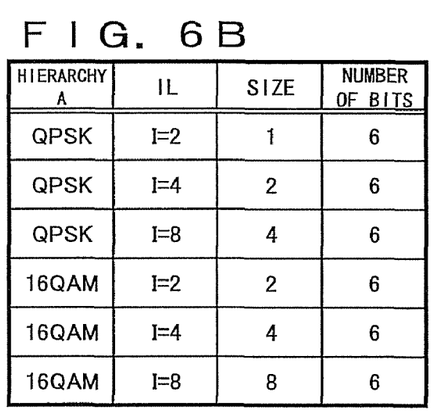
FIG. 6B shows the second table specifying relationships between transmission parameters and memory sizes required for deinterleaving processes.
Figure 6C:
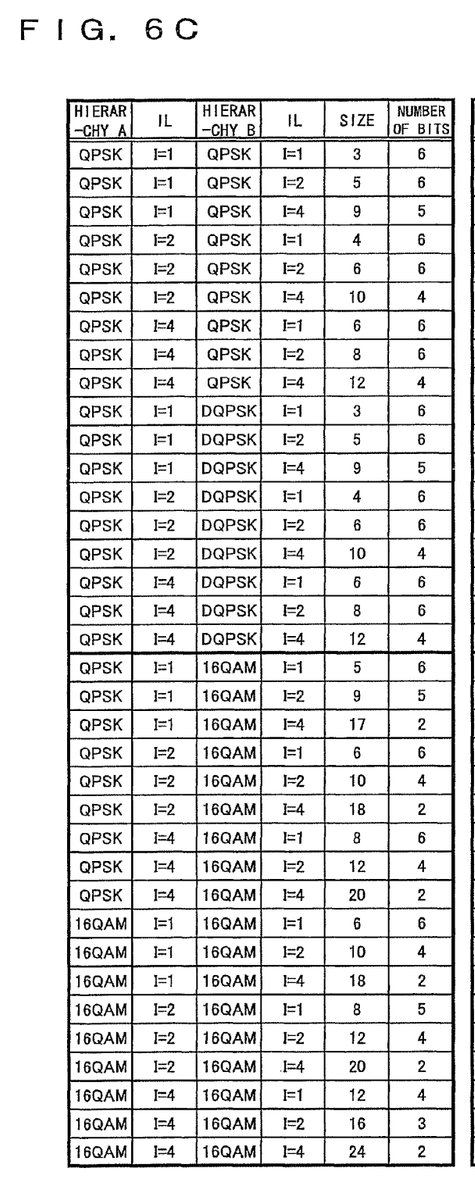
FIG. 6C shows the third table specifying relationships between transmission parameters and memory sizes required for deinterleaving processes.
Figure 6D:
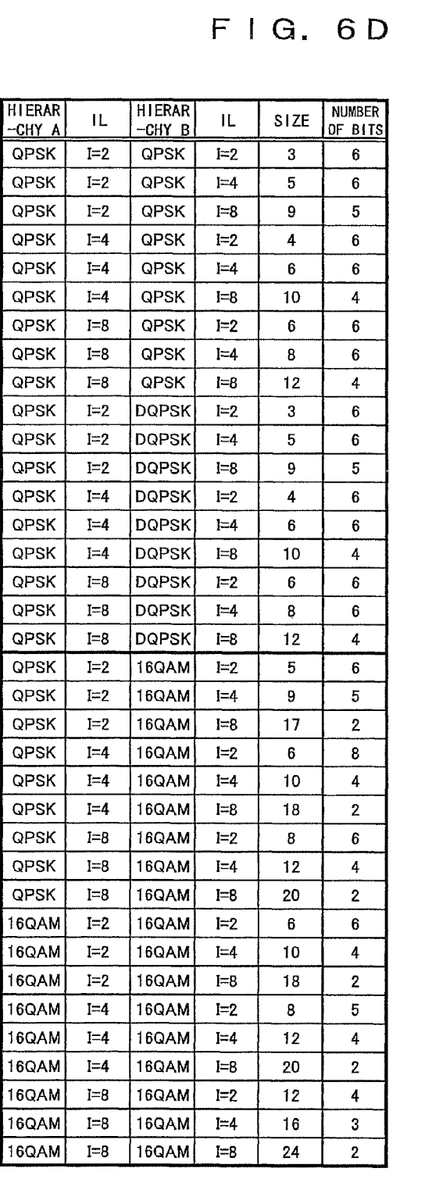
FIG. 6D shows the fourth table specifying relationships between transmission parameters and memory sizes required for deinterleaving processes.

Next, FIG. 6A, FIG. 6B, FIG. 6C, and FIG. 6D are explained. These figures show tables specifying relationships between transmission parameters standardized using ISDB-T and memory sizes required for the deinterleaving processes for receiving signals broadcast on the basis of these transmission parameters. FIGS. 6A and 6B specify the relationships in 1-segment broadcasting for each transmission mode that can be used. FIGS. 6C and 6D specify the relationships in 3-segment broadcasting for each transmission mode that can be used. Note that FIGS. 6A and 6C specify the relationships when the transmission mode is "MODE3", while FIGS. 6B and 6D specify the relationships when the transmission mode is "MODE2".

In 1-segment broadcasting based on ISDB-T, a transmission is possible on only one hierarchy. In 3-segment broadcasting based on ISDB-T, a multiple transmission is possible on two hierarchies of one segment (hierarchy A) and two segments (hierarchy B). The expressions of "hierarchy A" and "hierarchy B" in FIGS. 6A to 6D represent hierarchies in a hierarchical transmission.

Note also that the expression "IL" in FIGS. 6A to 6D represents a time interleave parameter, the interleave length in time interleaving processes.

In FIGS. 6A to 6D, the expressions of "number of bits" represent the number of bits in the above soft decision. For this soft decision, three bits are enough, and the number of bits is always three in the above first embodiment; however, the number of bits is increased up to six in order to improve performance by using redundant memory capacity in the case of a transmission parameter whose deinterleaving processes require a smaller memory capacity, as in the second embodiment explained hereinafter.

The expressions of "size" represent memory size required for the deinterleaving processes. The values of the sizes are specified as relative values with respect to the reference value "1" as the minimum value in the case when the broadcasting is a 1-segment broadcast, the transmission mode is "MODE3", the QPSK is used, the time interleave parameter I is "1", and the number of bits in the soft decision is six.

In the second embodiment of the present invention, in the 3-segment broadcasting shown in FIGS. 6C and 6D, when the "size" exceeds 16, i.e., when the 16 QAM is used as the carrier modulation method in hierarchy B among sub carriers and also the time interleave parameter is the largest possible value in the corresponding transmission mode (I=4 in "MODE2", and I=8 in "MODE3"), the "number of bits" as the transmission parameter is two. In these figures, the "size" value in the transmission parameter in which the "number of bits" is "2" is the value when the soft decision is made with three bits.

Thereby, it is possible to reduce the memory size required for the deinterleaving processes by two-thirds. In other words, in FIGS. 6C and 6D, the soft decision regarding the transmission parameter in which the "size" is "24", for example, is made with two bits; thereby, the "size" is 16. As a result, although the performance in this transmission mode becomes insufficient, the 1/3-segment receiver can be realized with a reduced memory capacity. It is to be noted that the transmission mode that causes the deterioration of the performance as above is thought to be rarely used for broadcasting. Accordingly, the above configuration rarely causes practical problems.

Figure 7:
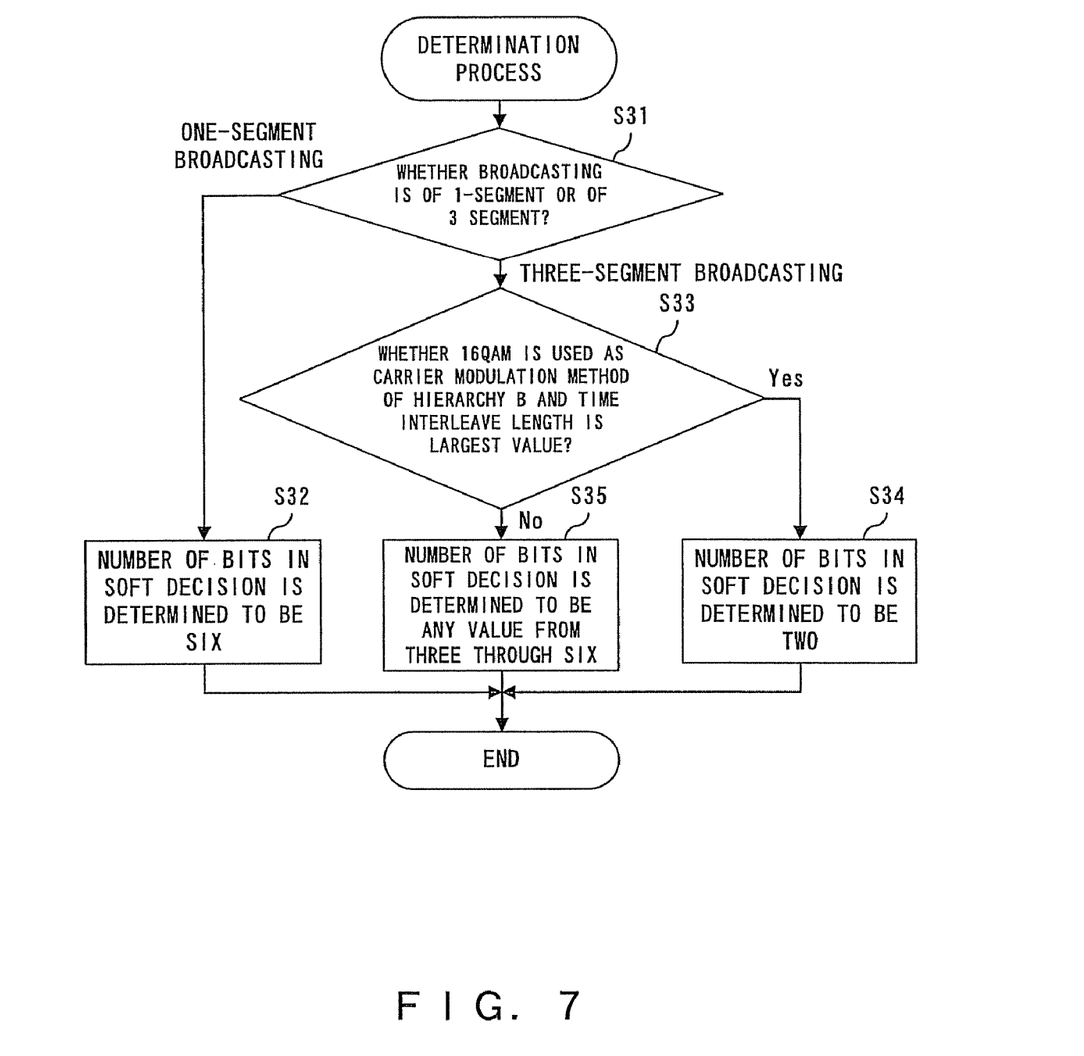
FIG. 7 is a flowchart explaining the determination process in the second embodiment.

FIG. 7 is explained here. FIG. 7 is a flowchart showing a process for determining the number of bits in the soft decision made in the determination processes 20-1 and 20-2 in the second embodiment.

First, in s31, it is determined, from the TMCC information that has been delayed by the one-symbol delay unit 19 in the determination process 20-2, whether the signal being received is of 1-segment broadcasting or of 3-segment broadcasting. When it is determined that the signal being received is of 1-segment broadcasting, the number of bits in the soft decision is determined to be six, and the demapping process 21 is notified of the determination result and the time deinterleaving process 23 in s32, then, the determination process is terminated.

When it is determined that the signal being received is of 3-segment broadcasting in s31, it is determined in s33, from the TMCC information delayed by the one-symbol delay unit 19 in the determination process 20-2, whether the 16 QAM is used as the carrier modulation method of the hierarchy B and whether the time interleave parameter is the value specifying the largest value in the corresponding transmission mode (I=4 in "MODE2" and I=8 in "MODE3"). When the determination result is Yes, the number of bits in the soft decision is determined to be two in S34, and the determination result is reported to the demapping process 21 and the time deinterleaving process 23; thereafter, the determination process is terminated. When the determination result is No, the number of bits in the soft decision is determined in S35 to be any integer value three through six in accordance with the redundancy that is obtained by subtracting the amount used for the time deinterleaving process from the amount of memory 23a provided for the time deinterleaving process 23, and the determination result is reported to the demapping process 21 and the time deinterleaving process 23; thereafter, the determination process is terminated.

As described above, according to the second embodiment, the number of bits in the soft decision is switched in accordance with the transmission parameters specified by the TMCC information such that the memory capacity required for deinterleaving processes can be reduced. Therefore, it is possible to reduce the size of a ⅓-segment receiver.

The embodiments of the present invention have been explained hereinabove; however, the scope of the present invention is not limited to the above embodiments, and various modifications/alterations that do not depart from the spirit of the present invention are allowed.

What is claimed is:

1. A receiver that receives a digital signal transmitted on the basis of an orthogonal frequency division multiplexing (OFDM) method, comprising:
   a demodulation unit which demodulates the digital signal;
   a demapping unit which demaps demodulated data output from the demodulation unit;
   a frequency deinterleave unit which executes a frequency deinterleaving process on data output from the demapping unit;
   a delay unit which delays control information superposed on the digital signal by a prescribed time period; and
   a time deinterleave unit which executes, on the basis of the interleave length specified by the control information delayed by the delay unit, a time deinterleaving process on data on which the frequency deinterleaving process has been executed.

2. The receiver according to claim 1, wherein:
   a soft decision is made with the number of bits determined on the basis of the control information in the demapping process.

3. The receiver according to claim 2, wherein:
   the number of bits is determined on the basis of the interleave length.

4. The receiver according to claim 2, wherein:
   the number of bits is determined on the basis of a modulation method of a subcarrier specified by the control information.

5. The receiver according to claim 2, wherein:
   the number of bits is determined in accordance with a redundant amount of memory that is obtained by subtracting, from memory capacity provided to the time deinterleave unit in advance, the amount of memory that is used for the time deinterleaving process.

6. A method of receiving a digital signal transmitted on the basis of an orthogonal frequency division multiplexing (OFDM) method, comprising:
   demodulating the digital signal;
   demapping demodulated data obtained by the demodulation;
   executing a frequency deinterleaving process on the demapped data;
   delaying control information superposed on the digital signal by a prescribed time period; and
   executing, on the basis of the interleave length specified by the delayed control information, a time deinterleaving process on data on which the frequency deinterleaving process has been executed.

7. The method of receiving a digital signal according to claim 6, wherein:
   a soft decision is made with the number of bits determined on the basis of the control information in the demapping process.

8. The method of receiving a digital signal according to claim 7, wherein:
   the number of bits is determined on the basis of the interleave length.

9. The method of receiving a digital signal according to claim 7, wherein:
   the number of bits is determined on the basis of a modulation method of a subcarrier specified by the control information.

10. The method of receiving a digital signal according to claim 7, wherein:
    the number of bits is determined in accordance with a redundant amount of memory that is obtained by subtracting, from memory capacity provided to the time deinterleaving process in advance, the amount of memory that is used for the time deinterleaving process.

* * * * *